United States Patent
Balcom et al.

(10) Patent No.: US 7,319,326 B2
(45) Date of Patent: Jan. 15, 2008

(54) SENSOR AND MAGNETIC FIELD APPARATUS SUITABLE FOR USE IN FOR UNILATERAL NUCLEAR MAGNETIC RESONANCE AND METHOD FOR MAKING SAME

(75) Inventors: Bruce J. Balcom, Fredericton (CA); Andrew E. Marble, Fredericton (CA); Igor V. Mastikhin, Fredericton (CA); Bruce Colpitts, Fredericton (CA)

(73) Assignee: University of New Brunswick, Fredencion, New Brunswick (CA)

( * ) Notice: Subject to any disclaimer, the term of this patent is extended or adjusted under 35 U.S.C. 154(b) by 0 days.

(21) Appl. No.: 11/232,904

(22) Filed: Sep. 23, 2005

(65) Prior Publication Data
US 2006/0066310 A1    Mar. 30, 2006

Related U.S. Application Data

(60) Provisional application No. 60/612,146, filed on Sep. 23, 2004.

(30) Foreign Application Priority Data
Sep. 19, 2005   (CA) ................................ 2530563

(51) Int. Cl.
*G01V 3/00*   (2006.01)
(52) U.S. Cl. ........................ 324/318; 335/297
(58) Field of Classification Search ............ 324/318; 335/296–298, 301–302, 304, 306
See application file for complete search history.

(56) References Cited

U.S. PATENT DOCUMENTS

| 4,445,102 | A | * | 4/1984 | Thorn et al. ................ 335/297 |
| 4,937,545 | A | * | 6/1990 | Chaillout et al. ........... 335/298 |
| 5,539,366 | A | * | 7/1996 | Dorri et al. ................. 335/297 |
| 6,204,665 | B1 | | 3/2001 | Triebe et al. |
| 6,538,545 | B2 | * | 3/2003 | Wakuda et al. ............. 335/296 |
| 6,694,602 | B2 | * | 2/2004 | Laskaris et al. ........... 29/602.1 |
| 2005/0040823 | A1 | * | 2/2005 | Blumich et al. ............ 324/307 |
| 2005/0128037 | A1 | * | 6/2005 | Doi et al. .................... 335/296 |

FOREIGN PATENT DOCUMENTS

| GB | 2174247 | 10/1986 |
| WO | WO 9314414 | 7/1993 |
| WO | WO 98/03887 | 1/1998 |

OTHER PUBLICATIONS

Guthausen et al, Analysis of Polymer Materials by Surface NMR via the MOUSE, Journal of Magnetic Resonance, 1998, pp. 1-7, vol. 130, Academic Press.

(Continued)

*Primary Examiner*—Brij Shrivastav
*Assistant Examiner*—Megann E Vaughn
(74) *Attorney, Agent, or Firm*—Eugene F. Denenyl

(57) ABSTRACT

A unilateral NMR sensor comprising a ferromagnetic yoke; a permanent magnet arranged on the yoke; a pole piece on the magnet; the pole piece including an air-pole piece interface surface whose shape corresponds to an equipotential contour of magnetic scalar potential.

30 Claims, 16 Drawing Sheets

OTHER PUBLICATIONS

Popella et al, Design and Optimization of the Magnetic Circuit . . . , The International Journal for Computation and Mathematics in Electrical . . . , vol. 20 No. 1, 2001 pp. 269-278.

Pederson et al, Application of the NMR-MOUSE to Food Emulsions, Journal of Magnetic Resonance, vol. 165, pp. 49-58, 2003.

Popella et al, Object-Oriented Genetic Algorithms for Two-Dimensional . . . , International Journal of Applied Electromagnetics and Mechanics, vol. 15, pp. 219-223, 2001/2002.

Eidmann, G. et al, The NMR Mouse, a Mobile Universal Surface Explorer, Journal of Magnetic Resonance, Series A 122, pp. 104-109, 1996.

Glover et al, A Novel High-Gradient Permanent Magnet for the Profiling of Planar Films and Coatings, Journal of Magnetic Resonance, vol. 139, pp. 90-97, 1999.

* cited by examiner

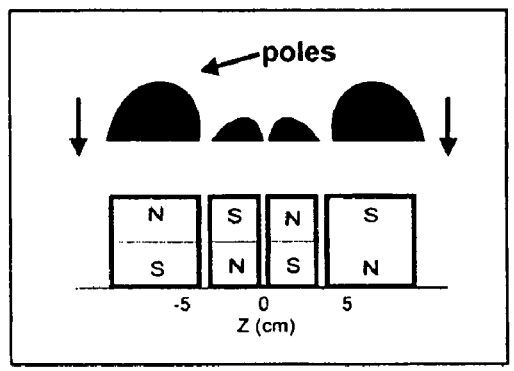
FIG. 14 (a) Magnet geometry
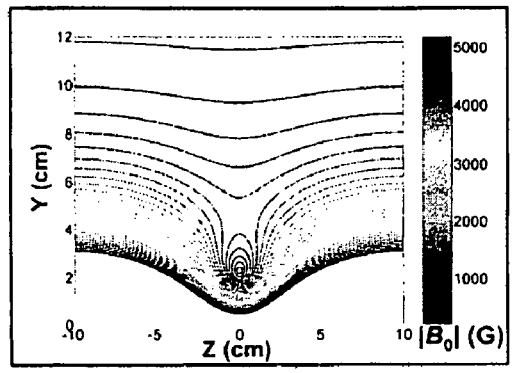
FIG. 14 (b) Calculated field, with poles
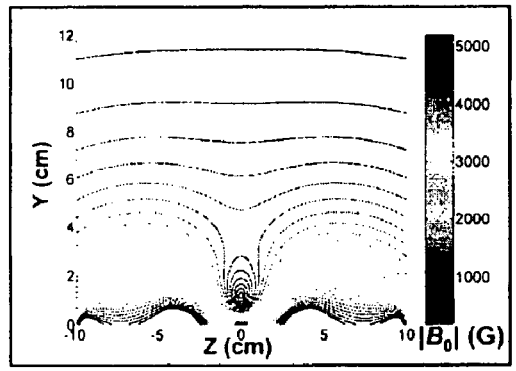
FIG. 14 (c) Calculated field, no poles
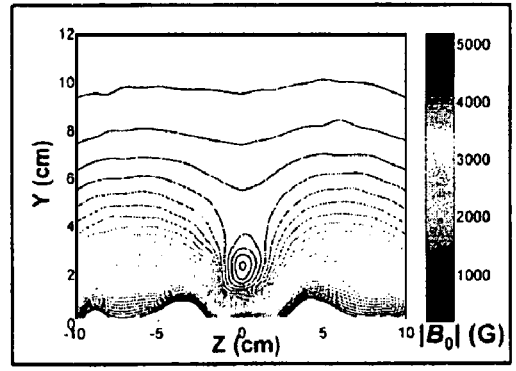
FIG. 14 (d) Measured, no poles

SENSOR AND MAGNETIC FIELD APPARATUS SUITABLE FOR USE IN FOR UNILATERAL NUCLEAR MAGNETIC RESONANCE AND METHOD FOR MAKING SAME

CROSS REFERENCE TO RELATED APPLICATIONS

This application claims the benefit of U.S. Provisional Application Ser. No. 60/612,146, filed Sep. 23, 2004. This application also claims priority to and the benefit of Canadian Application Serial No. 2,530,563 filed on Sep. 19, 2005.

BACKGROUND OF THE INVENTION

In a conventional nuclear magnetic resonance (NMR) experiment, the sample under study is placed in a homogeneous magnetic field produced by a superconducting solenoid. While this facilitates high signal-to-noise (SNR) and spatially resolved magnetic resonance imaging (MRI), it limits the range of samples that can be examined. In recent years, this limitation has been addressed by the introduction of 'inside out' or unilateral NMR sensors in which, the fringe field from a permanent magnet array is used to generate the static $B_0$ field in a volume displaced (remote) from the device. A surface coil or an alternate RF probe geometry is used to generate a remote $B_1$ field. The shapes of these inhomogeneous fields define a 'sensitive volume' or 'sensitive spot' where components of the two fields are orthogonal. Designs of this type allow near surface measurements to be made on samples of arbitrary sizes previously inaccessible to NMR. Furthermore, small permanent magnet designs are easily transported, making them suitable for field applications. The strong gradient inherent in these designs can be exploited to investigate slowly diffusing samples, or to suppress the signal from rapidly diffusing samples.

Inside-out NMR was first used in the oil industry for well logging. Later, Eidmann et al. developed a portable unilateral NMR sensor known as the NMR-MOUSE (see G. Eidmann, R. Savelsberg, P. Blümler, B. Blümich, The NMR MOUSE, a mobile universal surface explorer, J. Magn. Res. A 122 (1996) 104-109). The Eidmann design employs a 'U' magnet geometry in which two permanent magnets are arranged on a ferromagnetic yoke in opposite orientations with a gap between them. The $B_0$ field curls between the two magnets, giving a component parallel to their faces in the area over the gap. A surface coil in the gap with its axis normal to the face of the magnets provides the $B_1$ field.

Significant drawbacks exist with the NMR-MOUSE. The $B_0$ field provided by the magnet array is inhomogeneous in all directions and suffers from a strong (10-50 T/m [8]), nonlinear gradient in the direction normal to the array. This results in short signal lifetimes, obscuring chemical shift information and resulting in low SNR measurements. The strong nonlinearity of the gradients results in an ill defined sensitive volume precluding conventional spatially resolved measurements. The strong gradient causes every RF excitation to be slice selective; the size, shape, and position of the excited volume are determined by the bandwidth and frequency of the RF pulse sequence used. These effects limit the effective resolution of the sensor by obscuring the location and distribution of the spin population observed in a measurement. The strong gradient also requires additional RF circuitry to be employed in order to vary the excitation frequency over a wider range in spatially resolved measurements.

To address the drawbacks of early unilateral NMR systems, several designs have been proposed. Using a single bar magnet to provide $B_0$, Blümich et al. developed a unilateral NMR sensor with a small sensitive volume directly over one of the poles of the magnet (see B. Blümich, V. Anferov, S. Anferova, M. Klein, R. Fechete, M. Adams, F. Casanova, Simple NMR-mouse with a bar magnet, Concepts in Magnetic Resonance B 15 (2002) 255-261). In this volume, the gradient parallel to the magnet face is negligible while the gradient normal to the magnet face is strong but approximately linear. While this design offers some advantages in certain applications, the $B_0$ field is orthogonal to the face of the magnet, excluding the use of a simple surface coil to generate $B_1$. Specially designed planar coils must be used, resulting in a decrease in sensitivity.

Many other designs exist wherein the position of magnets in an array is modified in order to achieve some desirable characteristic in the topology of $B_0$. The common feature of these designs is that all deal with a forward problem: given a particular magnet array, determine the resulting $B_0$ field and subsequently determine how this field topology can be applied to achieve experimental goals. There is a need therefore, for an NMR sensor and method to address the inverse problem: given an experimental goal, select an appropriate $B_0$ topology and synthesize a design for an instrument providing this field.

Methods of simulating the $B_0$ field due to a given arrangement of magnets exist. One such example is the Finite Element (FEM) approximation. Designs can be optimized by performing successive simulations while varying parameters to minimize some goal function and this technique has previously been employed in unilateral magnet design. The drawback of this approach is that specific parameters (eg. size, position and strength of magnets) must be selected for the optimization and the parameter space must be empirically selected to suit the desired magnet topology. Furthermore, conventional simulation techniques are computationally expensive, leading to long optimization times, and constraining the number of parameters that can be optimized.

The use of high permeability material is standard in the design of closed permanent magnet NMR systems, where high permeability 'pole pieces' are used to control $B_0$ between the magnets. Many methods of shaping the pole pieces to provide an optimal $B_0$ topology have been proposed, however all deal with generating a homogeneous field between two magnets and cannot be directly applied to the unilateral case. Clover et al. have presented a permanent magnet based 1-D profiling system in which pole pieces, shaped according to contours of magnetic scalar potential, were used to give a desired static field (see P. M. Glover, P. S. Aptaker, J. R. Bowler, E. Ciampi, P. J. McDonald, A novel high-gradient permanent magnet for the profiling of planar films and coatings, J. Magn. Res., 139 (1999) 90-97). This approach is attractive in that it offers a low complexity method of configuring magnets and pole pieces to control $B_0$ but the profiling system in Glover et al. is a closed magnet assembly.

SUMMARY OF THE INVENTION

Accordingly, in one embodiment, the invention relates to a planar array of magnets fitted with pole pieces of high permeability material wherein the shape of the pole pieces is derived from a linear combination of solutions to Laplace's equation. The shape of the pole pieces correspond to equipotential contours of magnetic scalar potential.

In another embodiment, the invention relates to a method in which the magnetic field over a magnetic array is represented using a parameterized analytical expression and optimizes the parameters to give the desired $B_0$ within a specified sensitive volume. Contours of the magnetic scalar potential associated with the expression for $B_0$ are then selected to define the shape of high permeability metal placed over a planar array of permanent magnets. The combination of the metal and the magnets shapes the field in the desired manner. The method allows the size, shape, and gradient of a sensitive spot displaced from the array to be controlled to create a uniform field sensitive spot. In a further embodiment, the sensitive spot has a linear magnetic field gradient perpendicular to the surfaces. The accuracy of the field topology generated by the array is commensurate with the order of the solution.

BRIEF DESCRIPTION OF THE DRAWINGS

FIG. 14a is a magnet array according to the invention.

FIG. 14b is a contour plot of the calculated field, with poles.

FIG. 14c is a contour plot of the calculated field, without poles.

FIG. 14d is the measured field, without poles.

GENERAL DESCRIPTION OF THE INVENTION

Figure 3:
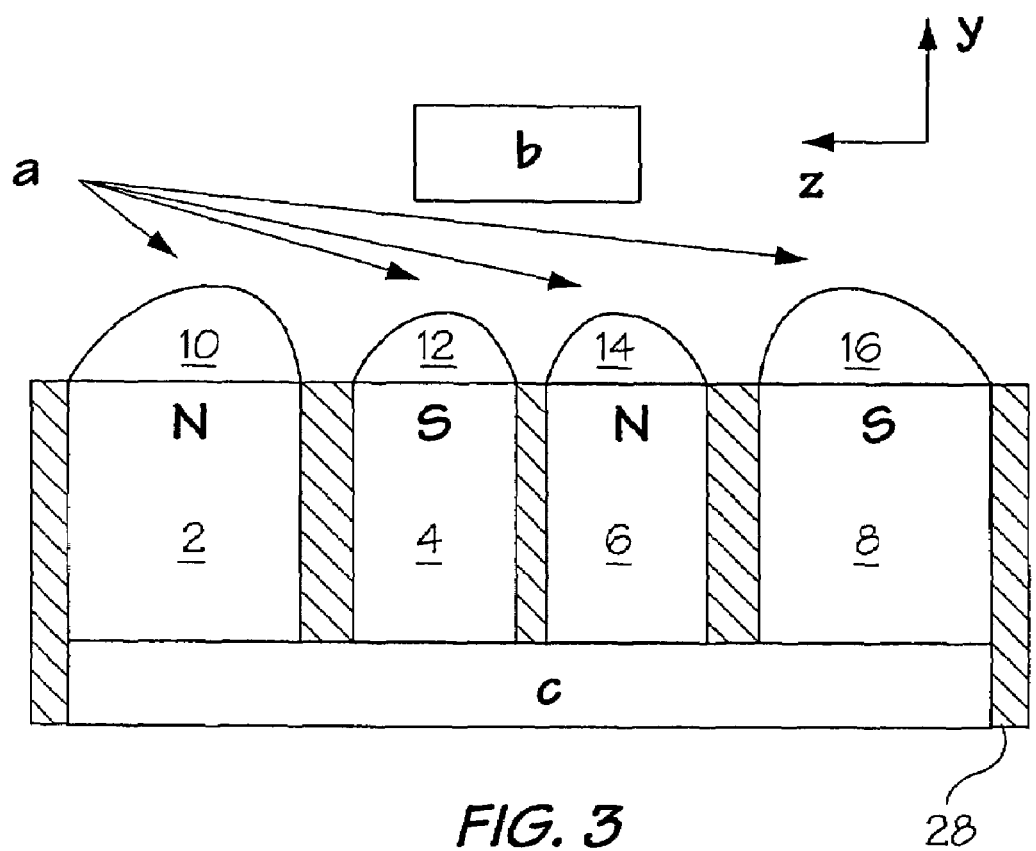
FIG. 3 is a diagram of a fabricated array according to the invention.

Referring to FIG. 3, a unilateral NMR sensor is comprised of a planar array of permanent magnets 2, 4, 6 and 8 fitted with pole pieces 10, 12, 14 and 16 of high permeability material. The magnets 2, 4, 6 and 8 are mounted on a ferromagnetic yoke (c) in an aluminum frame 28. Pole pieces are an interface between a high strength permanent magnet and air (an air-pole interface). A pole piece is a section of material with a high magnetic permeability used to shape a magnetic field. The exact value of the magnetic permeability is not important but must be much larger than unity; this ensures that any magnetic field at the boundary between the pole piece and air is directed normal to the pole piece surface. With the field perpendicular to the pole piece surface, the surface can be treated as a contour of constant magnetic scalar potential. This allows the magnetic field above the pole pieces to be calculated.

Different high permeability ferromagnetic alloys may be used for the pole pieces. Preferably, the main requirements for the materials for the pole pieces are (1) high (>100) relative permeability; (2) a saturation magnetization higher than the desired magnetic field strength, although in other embodiments, the pole pieces can be partially saturated.

A static magnetic field vector, $\vec{B}$, can be described in terms of a magnetic scalar potential, $\phi$, as $$\vec{B} = \nabla \phi. \quad (1)$$

Since magnetic fields do not diverge, the divergence of Eq. (1) gives Laplace's equation, $$\nabla^2 \phi = 0 \quad (2)$$

the solution of which is well known. The air-pole piece interface indicated generally at "a" in FIG. 3, can be analyzed as having a constant magnetic scalar potential. Magnetic scalar potential is denoted by $\phi$ and by definition, satisfies Laplace's equation.

The methods of the present invention, when used for creating a two-dimensional design, use contours of $\phi$ in a two-dimensional space, preferably, the z-y plane, extended along the x-axis, and thus only the two dimensional solution to Laplace's equation is considered. In two dimensions, by writing $\phi$ as the product of two one dimensional functions, the following particular solution is selected:

$$\phi(z, y) = e^{-ay}[b \cos(az) + c \sin(az)] \quad (3)$$

where a, b, and c are arbitrary constants. Because the Laplacian operation is linear, a linear combination of solutions of the form of Eq. (3) will also satisfy Eq. (2). For our application, it is desired that the magnetic field be parallel to the plane of the magnet array. It follows that the magnetic potential should be an odd function with respect to the center of the array, allowing the field to curl from one side to the other. Accordingly, b is set to zero and $\phi$ is written as:

$$\phi(z, y) = \sum_{i=0}^{N-1} e^{-a_i y} c_i \sin(a_i z) \quad (4)$$

It will be understood that the b coefficient will not always be set to zero depending on the particular NMR application. The magnetic field due to the potential described by Eq. (4) can be calculated using Eq. (1), resulting in $$\vec{B} = \frac{\partial \phi}{\partial z}\hat{z} + \frac{\partial \phi}{dy}\hat{y} \quad (5)$$

$$= \sum_{i=0}^{N-1} a_i c_i e^{-a_i y}[\cos(a_i z)\hat{z} - \sin(a_i z)\hat{y}].$$

For an $N^{th}$ order design, the parameter vectors $A=[a_0 a_1 \ldots a_{N-1}]$ and $C=[C_0\ c_1 \ldots c_{N-1}]$ can be selected to approximate a desired $\vec{B}$ over a region of interest (ROI). Sample calculations and finite element simulations have shown that larger values of N will result in better control of $\vec{B}$, at the cost of design complexity.

Following methods taught by Glover et al., supra, and incorporated herein by reference, the surface of a high permeability ($\mu_r \gg 1$), linear, isotropic material can be approximated as an equipotential contour of $\phi$. Thus, a potential described by Eq. (4) can be realized using pole pieces shaped according to the contours of $\phi$=constant, mounted on permanent magnets of an appropriately chosen strength. This design method defines a family of magnet arrays suitable for unilateral NMR applications. The two-dimensional designs can be realized in three dimensions by making the magnets and pole caps sufficiently long in the x-direction such that edge effects are not present over the center of the array. Several approximations are used in the design method of the present design. The effects of the finite length of the array in the x-direction have been neglected. This is common practice in unilateral NMR magnet design although its ramifications are rarely discussed in the literature. The analytical design also assumes that $\phi$ is periodic in the z-direction. In an embodiment of the invention, the scalar potential becomes truncated due to the finite size of the magnet array. Simulations have indicated that $B_0$ can be controlled for y and z close to the array in a design of finite size.

Figure 1:
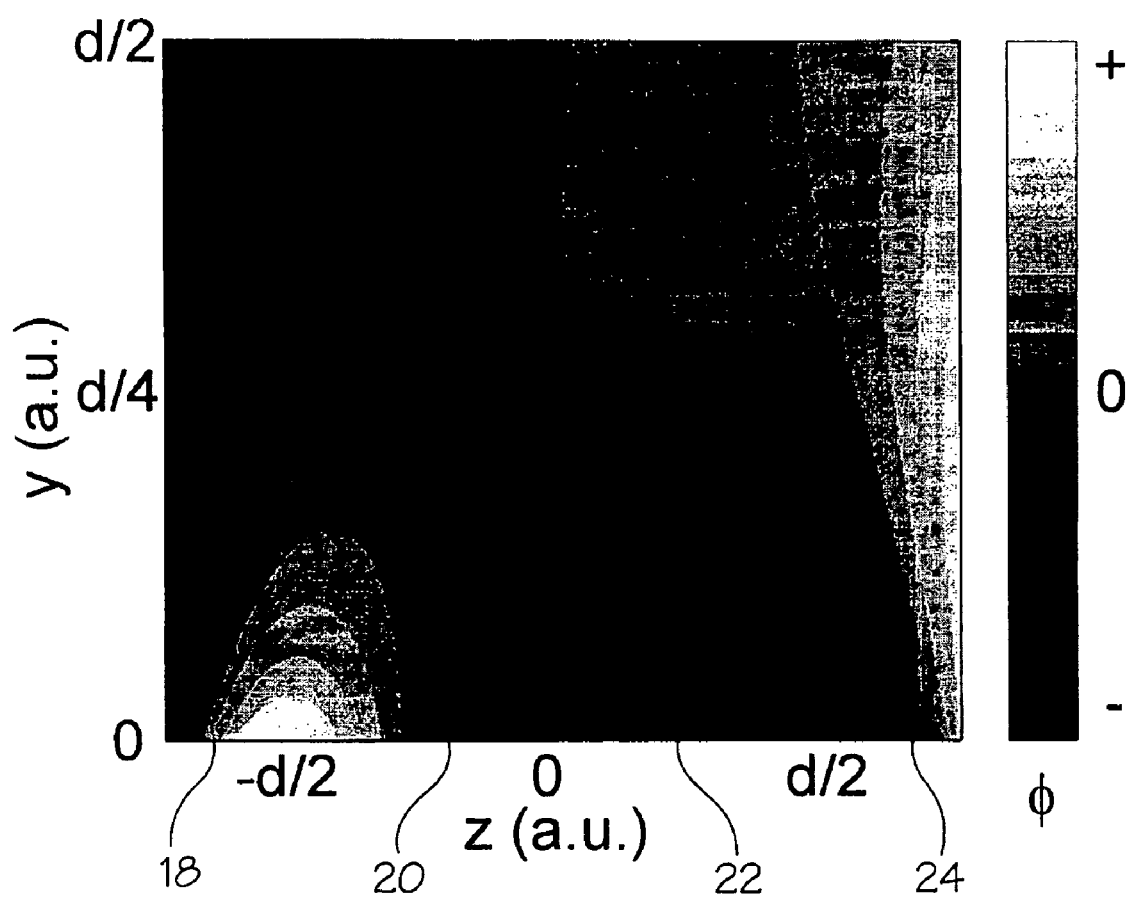
FIG. 1 is a contour plot of the optimized magnetic scalar potential for a design of an NMR sensor according to the invention, given by Eq. (4).

In a preferred embodiment of the invention, the method of determining the shape of the pole pieces for a magnetic array to achieve a desired magnetic field topology for a target region comprises the steps set out below:

In two dimensions, a solution to equation (2) is $$\phi(z, y) = \sum_{n=1}^{N} e^{-a_n y}[b_n \cos(a_n z) + c_n \sin(a_n z)] \quad (3)$$

where $a_n$, $b_n$, and $c_n$, are arbitrary constants. The corresponding magnetic field above the pole pieces is obtained by taking the gradient of this potential. This magnetic field can be controlled according to the following steps:

A target region in a two-dimensional plane, such as the z-y plane in FIG. 1, is defined, along with a corresponding target magnetic field topology for the region. For example, it could be desired that the field variation within the region is within a certain tolerance.

(ii) The array design is centered around the origin. In order to control the principal direction of the magnetic field, one of the sine/cosine terms in the desired potential is set to zero for all n. Even symmetry (including the cosine term) in the potential will give a field principally directed perpendicular to the surface of the magnet array with the flux return path leading towards the underside of the array. Odd symmetry (including the sine term) gives a field that curls from one side of the array to the other causing it to be principally directed parallel to the array over the center of the design.

(iii) The order N of the design is selected. This is done iteratively as a higher order will allow finer control of the magnetic field but will also increase the complexity of the design. Typically, the orders selected will be between 2 and 6.

(iv) The spatial frequencies, $a_n$ are selected. Typically, $a_1$ is chosen such that one full period ($2\pi/a_1$) is equal to the desired width of the magnet array, and higher frequencies are given by $a_n = na_1$. In this way, all spatial frequencies present in the design represent an orthogonal set, similar to a Fourier series.

(v) The coefficients ($b_n$ or $c_n$) are determined in order to minimize the difference between the desired and actual magnetic fields in the target region. These parameters can, for example, be varied systematically using nonlinear optimization techniques. In this stage, the order can be adjusted as necessary to give the desired accuracy.

(vi) The coefficients determined in steps (iv) and (v) specify a scalar potential that will give the desired magnetic field. By examining a contour plot of this potential, appropriate contours can be selected to be used as the shapes of the pole pieces. FIG. 1 shows a shaded contour plot of an, example scalar potential distribution. Contours 18, 20, 22 and 24 selected for pole pieces are highlighted with thick lines. The selected contours must all be below the minimum y-value in the target field region, also referred to as the target sensitive volume indicated by the dashed box 26, ensuring the array can be used with arbitrarily sized samples. Within this constraint, the contours should be as close to the sensitive volume as possible in order to maximize the strength of the magnetic field and reduce field variations that can occur further from the pole pieces due to the finite size of the magnet array.

A bottom plane (y-value) must be selected to define the bottom of the pole pieces, where the magnets are located. In FIG. 1, this plane is simply y=0. In a physically realizable design, appropriate contours of $\phi$ will intersect twice with this plane, defining the size and position of one or more pole pieces. Contours should be selected such that the surface of the array will be covered fully by the pole pieces, with small gaps left only to aid in the positioning of the magnets. If at this stage it is determined that the design is not physically realizable, the order or target field may be adjusted.

Contours need not be of the same magnitude. Positive and negative contours lead to magnets oriented in opposite senses. For example, a positive contour could correspond to a magnet with its north pole below the pole piece.

(vii) The magnet array, including both magnets and pole pieces, is simulated in 2D in order to determine realistic values for the magnetic field strength. Magnets are selected to be of the same width as the pole pieces above them (see FIG. 3). As a guideline, magnet strengths should be chosen in proportion to the different magnitudes of the chosen scalar potential contours, however these can be varied to adapt the design to available magnet strengths.

(viii) The contours which define the shapes of the pole pieces in two dimensions are used to construct 3D pieces by extending them in the third dimension.

Figure 4:
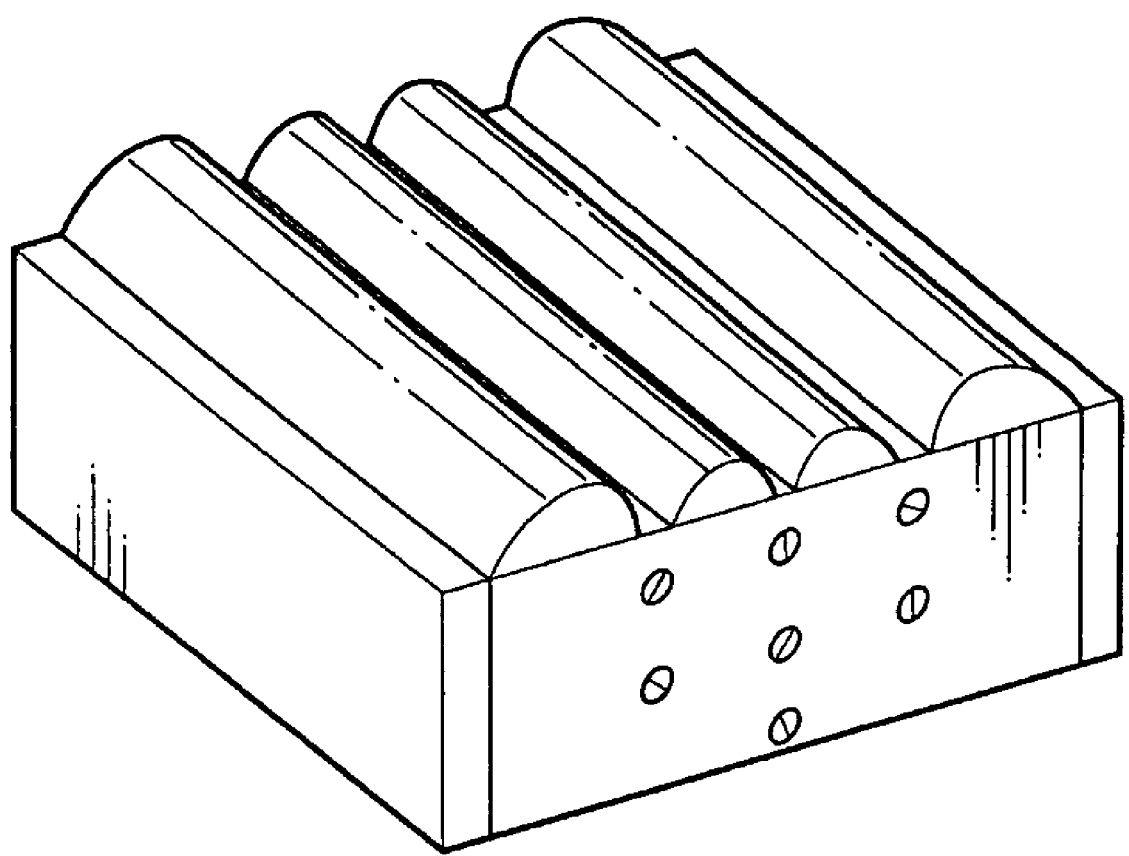
FIG. 4 is a photograph of the constructed array of FIG. 3.

FIG. 4 is a photograph of a magnetic array according to the invention designed using the method of steps (i) to (viii). In the array of FIG. 4, the magnets are Nickel plated N48. The yoke (not shown) is iron, and the frame 26 is aluminum.

In the embodiment discussed above, equipotential contours of scalar potential are selected in two dimensions whereby only the two dimensional projection of an air-pole interface is a contour of scalar potential.

The methods of the invention can by adapted to three dimensional designs for magnetic arrays.

EXAMPLE 1

The method described above was used to design a magnetic array for unilateral sensor for the detection of moisture ingress into graphite/aluminum/epoxy composite sandwich panels. The primary design goals for this magnet array were: (1) a large sensitive volume to combat the poor SNR inherent in this sample; (2) a low resonant frequency to mitigate interactions between $B_1$ and the conductors in this structure.

From Eq. (3), it is clear that any units of length can be chosen for the array design, and thus the magnet array can be designed in arbitrary units and scaled to a desired size as appropriate. In this example, the solution space has a width of approximately d units. The ROI is 0.275 d units above the plane of the magnets and centered over the array. It is 0.25 d units in width and 0.1 d units in height. Within the ROI, it is desired that $|B|$, the modulus of $\vec{B}$, should be constant, giving a constant resonant frequency, $\omega_0$, inside this volume. In order to achieve the desired field within the ROI, a cost function was developed. In this example, the deviation of $|B|$ from its mean value over the ROI was minimized. The resulting design goal can be represented mathematically by $$\min_{A,C} \int\int_{ROI} (|B| - |\overline{B}|)^2 dz dy, \quad (6)$$

where $|\overline{B}|$ is the average modulus of $\vec{B}$ over the ROI. Although this was the minimization criteria used, it suffers the notable disadvantage of having the trivial solutions $a_i=0$ and $c_i=0$, necessitating that $a_0$ and $c_0$ be fixed. However, there are advantages in fixing $a_i$, and fixing $c_0$ will simply have a scaling effect on the solution. Thus Eq. (6) is equivalent to evaluating $$\min_{A,C} \int\int_{ROI} (|B| - D)^2 dz dy,$$

for some constant D. The exact function to be minimized is dependent on the desired field configuration. For example, if it was desired that B had no y-component and a constant gradient, G, in the y-direction centered about $y_0$, the minimization problem could be $$\min_{A,C} \int\int_{ROI} [(B_z - (D + G(y - y_0)))^2 + (B_y - 0)^2] dz dy.$$

The cost function given in Eq. (6) was evaluated to determine the optimal parameters for N=3. This order was selected as a compromise between accurate control of $B_0$ and complexity of the resulting magnet array. In order to better define the problem, values were selected for the parameter vector A. The terms, $a_i$ are arguments of the sine function in Eq. (4) and thus represent spatial frequencies present in the scalar potential. It thus makes sense to include frequencies describing large scale variations across the array geometry, as well as higher frequencies describing local detail within the pole caps. Accordingly, $a_0$ is selected to correspond to a 'fundamental' frequency, $a_0=2\pi/d$. In this example, subsequent values of $a_i$ were set to $a_1=(4/3)\pi/d$ and $a_2=\pi/d$. These three frequencies cover a relatively narrow range of detail in the shape of the pole pieces and were selected as a compromise between design complexity and accurate approximation of the desired field. In principle, these values need not be specified and appropriate parameters will arise naturally as a result of the optimization. In this case, it would have been necessary to modify the goal function in order to ensure that the optimal $\phi$ could be realized with a unilateral design.

With A set, the optimal value of C was determined by minimizing the cost function over a discrete solution space using the Matlab optimization toolbox. The parameter $c_0$ was fixed in order to avoid a trivial solution in the optimization. FIG. 1 shows a contour plot of the scalar potential resulting from the optimization of the remaining parameters. The ROI is indicated by the dashed box 26. The thick solid lines 18, 20, 22 and 24 represent the contour lines selected as pole pieces. The selected contours are as close to the ROI as possible as the magnetic field will always decay rapidly with distance from the magnets. The magnitude of $\phi$ for the inner two contours is $\frac{1}{7}$ the magnitude for the outer contours. The sign of $\phi$ alternates between positive and negative for each of the poles. It is important to note that the number of pole pieces was not specified in order to achieve the design. The shape of the contours is solely the result of minimizing Eq. (6) with the constraints discussed.

Figure 2:
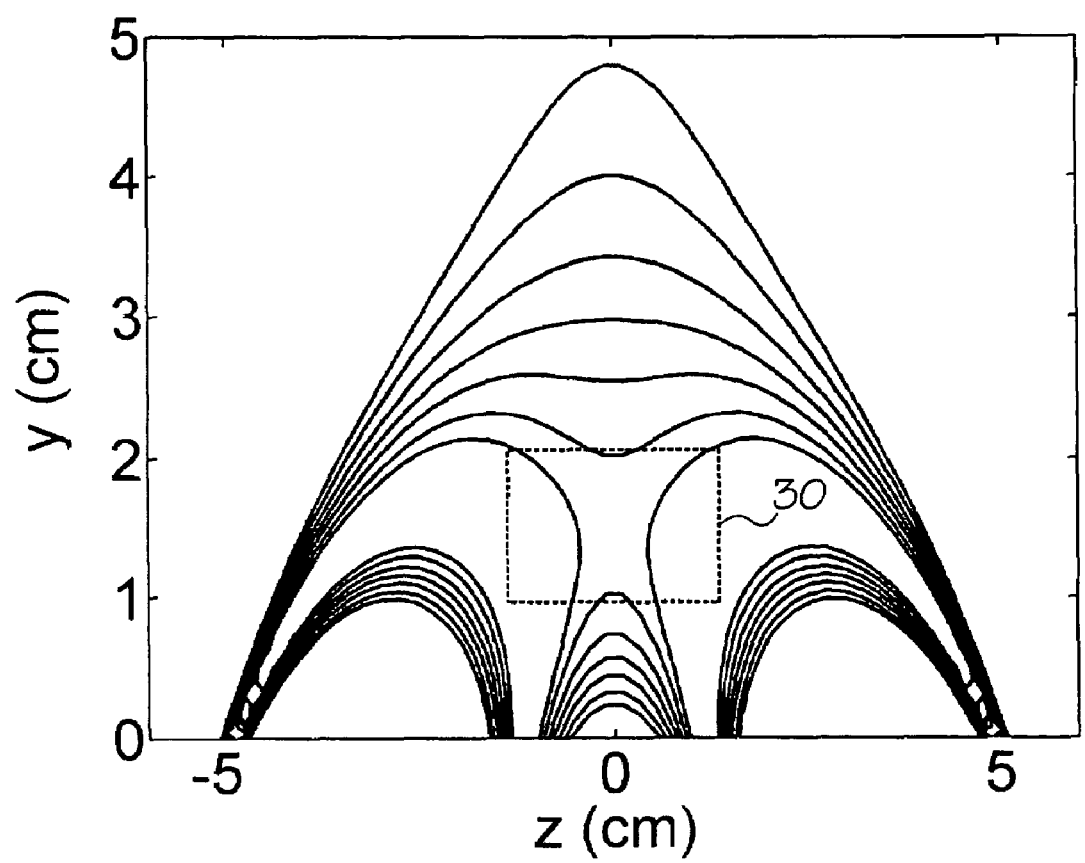
FIG. 2 is a contour plot of the z-component of the theoretical magnetic field for a design, determined analytically as the gradient of the scalar potential field shown in FIG. 1.

Taking the gradient of $\phi$ gives the magnetic field strength, B. FIG. 2 shows a contour plot of the x-component of the field, $B_x$, due to the scalar potential depicted in FIG. 1. The target sensitive volume is denoted by the dashed box 30. The position, y=0, corresponds to the surface of the inner pole pieces. The field contours represent an 8% change in the magnetic field strength. The actual field strength is dependent on the strengths of the magnets used in the construction. It is observed that there is a saddle point at the center of the target sensitive volume.

In FIG. 2, the solution has been scaled such that the distance between the opposite edges of the outer pole caps is 15 cm (6"). The contours are given in percent as the absolute field strength will depend on the strength magnets used in the design. It is observed that the spatial variation of $B_x$ within the ROI is at a minimum. At the center of the ROI, the field gradient is zero. In the calculated solution, $B_x$ increases in magnitude as y increases. This occurs because the calculation assumes that $\phi$ can be controlled everywhere. In a practical implementation, $B_0$ must always eventually fall off with distance from the magnets. However, near the array, the shape of $B_0$ is readily controlled using the pole caps.

Using the contours shown in FIG. 1, a four-magnet array was constructed. The geometry of the array is depicted in FIG. 3. The pole pieces 10, 12, 14 and 16 rest over the permanent magnets 2, 4, 6 and 8, whose relative field directions (North/South) are indicated by "N" and "S" respectively in FIG. 3. The target sensitive volume is highlighted by the box (b). The area (c) is an iron yoke, used to concentrate and contain the magnetic field on the bottom of the array. The hatched area represents the aluminum structure 28 used to house the magnets. The pole pieces are bolted to the aluminum 28 at either end as shown in FIG. 4. The outer magnets were 5 cm (2") in height and 4 cm (1.7") in width, while the inner magnets were 2.5 cm (1") wide. The entire array was 15 cm (6") wide, and was made to be 15 cm (6") long in the x-direction.

The magnets were housed in an aluminum frame with an iron yoke concentrating the field at the bottom of the array. In order to safely place the magnets in the frame, 0.95 cm (⅜") holes were drilled through the yoke under the slot for each magnet. The holes were tapped allowing nonmagnetic threaded rod to be fed through them. A guiding structure was then built to fit over the frame, allowing each magnet to be inserted in turn away from the others. By turning the threaded rod back out of the frame, the magnets were slowly lowered into position in a controlled manner.

The pole pieces were machined from high permeability steel using a 3-axis ES-V4020 CNC vertical machining center. Threaded holes were drilled in the flat face of the pole pieces, allowing them to be bolted up through the aluminum frame. Nonmagnetic brass screws were used in all aspects of the construction. FIG. 4 shows a photograph of the array. The yoke (not visible) is attached below the magnets (not shown). The pole pieces are machined from high permeability steel. The four NdFeB magnets are housed under the pole pieces. Each has a surface field strength of 0.5 T.

Design Validation

In order to compensate for the differences between the analytical design and the manufactured array, the array was simulated using the FEMLAB finite element simulation software. Magnetic fields in y-z plane were evaluated assuming the array was infinite in the x-direction.

Figure 5:
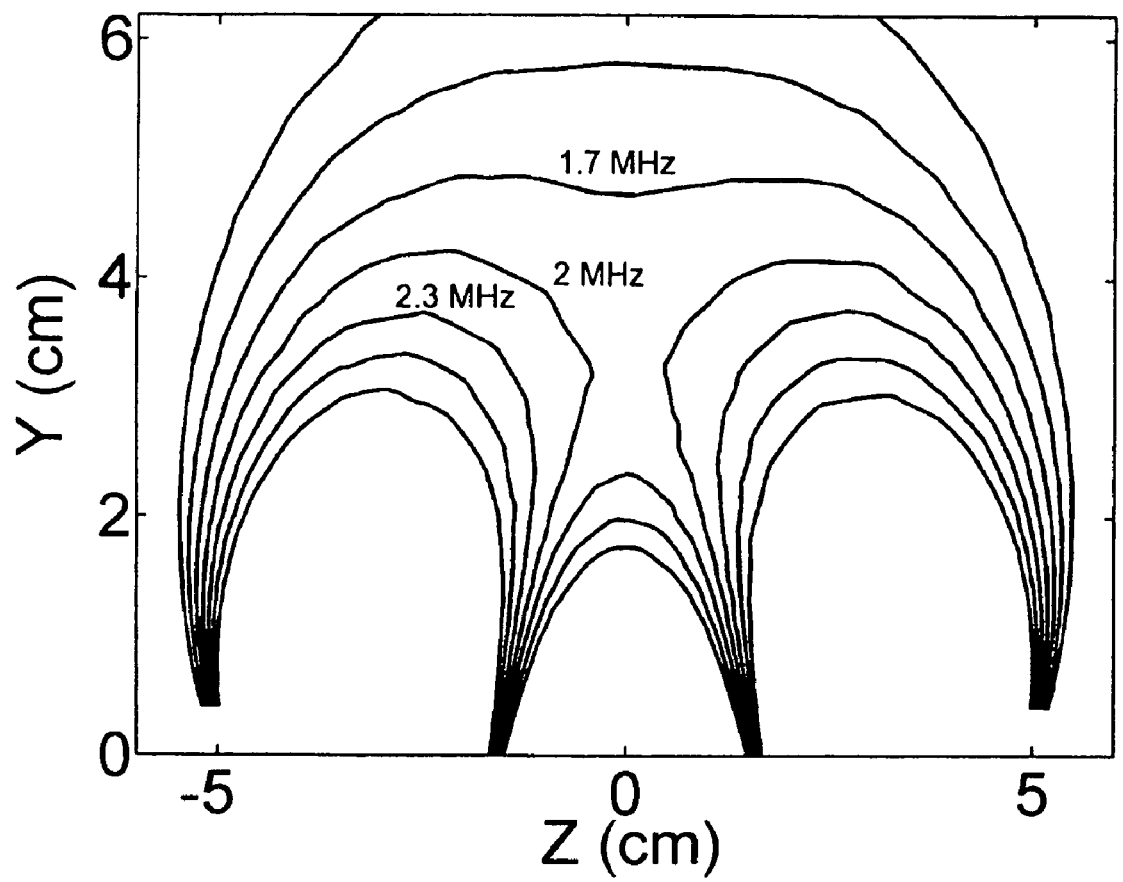
FIG. 5 is a simulated magnetic field ($B_z$) contour plot for the array of FIG. 3.

FIG. 5 shows a simulated contour plot of the z-component of $B_0$. The field strength is expressed as contours of the resonant frequency for $^1H$ according to Larmor equations. The position y=0 corresponds to the upper surface of the inner pair of pole pieces. Only the z-component is presented as this is the main component of $B_0$ and is readily compared to measurements from the fabricated array using a 1-axis gaussmeter. The shape of the simulated field is clearly similar to that predicted by the analytical expression. The saddle point in the magnetic field strength is again present over the center of the array, however it is displaced in the y-direction due to differences between the magnets used in fabrication and those specified in the design. At large (y,z), the field topology deviates from its predicted shape because of the finite dimensions of the array.

It is immediately apparent that the simulation results agree with the analytically determined field topology presented in FIG. 2. The saddle point in the field is present but is displaced due to changes in the relative strengths of the magnets. For large values of y and z, there is a deviation between the analytical and simulated results as the analytical results assume that $\phi$ can be controlled everywhere.

Figure 6:
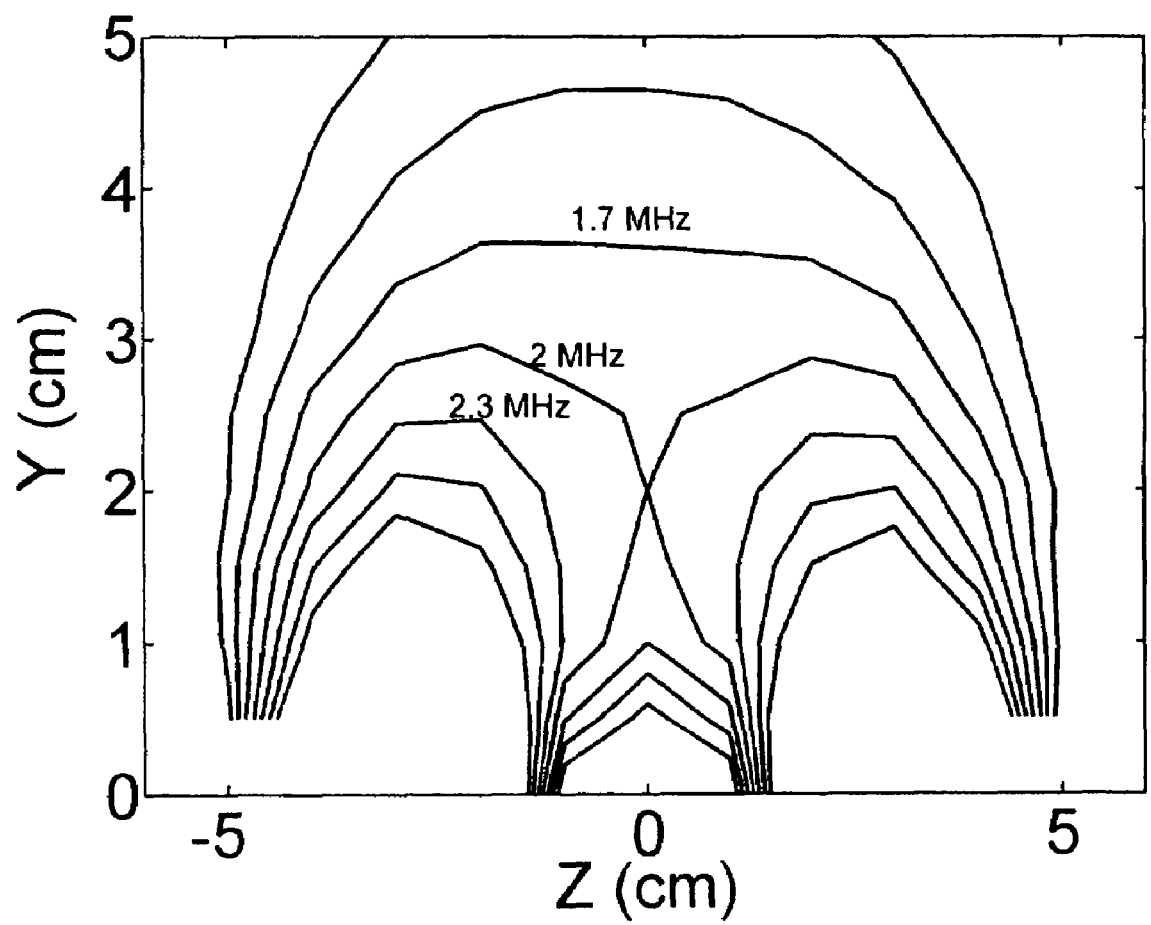
FIG. 6 is a measured magnetic field contour plot for the array of FIG. 3.

Using a Lakeshore 450 1-axis gaussmeter, the z-component of the magnetic field from the fabricated array was measured over the center of the x-dimension of the magnets on a 1 cm grid. A plot of the measured magnetic field, presented as $^1H$ frequency contours, is shown in FIG. 6 shows that the overall distribution of field lines in the plot is consistent with that presented for the simulated array. The field contours are labeled in MHz for $^1H$ magnetic resonance according to the Larmor equation. The result is in congruence with the simulated result in FIG. 4. The distance, y, is measured from the upper surface of the inner set of pole pieces. The observed shift in the position of the sensitive volume is attributed to differences between the fabricated and simulated magnets and pole pieces, along with inaccuracies in the field measurement introduced by errors in the position and orientation of the hall sensor. The sensitive volume is indicated by the saddle point in the plot. It is ~1.5 cm in width and ~1.5 cm in height and is centered about 2 cm up from the inner pole pieces. There is a slight difference between the position of the sensitive spot in the measured and simulated results. This systematic difference is attributed to the combined effects of differences between the actual and simulated magnetic fields for the magnets, along with a small change in the height of the manufactured pole pieces, introduced to facilitate their fabrication.

Experimental Results

Several sample NMR measurements using a prototype array according to the invention were tested. In each case, the resonant frequency was 2.01 MHz and a 10 turn, capacitively coupled, 2 cm diameter surface coil positioned above the array was used for the measurements. The coil quality factor was approximately 27. The size of the surface coil limits the size of the sensitive volume in the x-direction, while the dimensions of the homogeneous region of $B_0$ limit the volume in the y-z plane.

NMR Signal Characteristics

Figure 7:
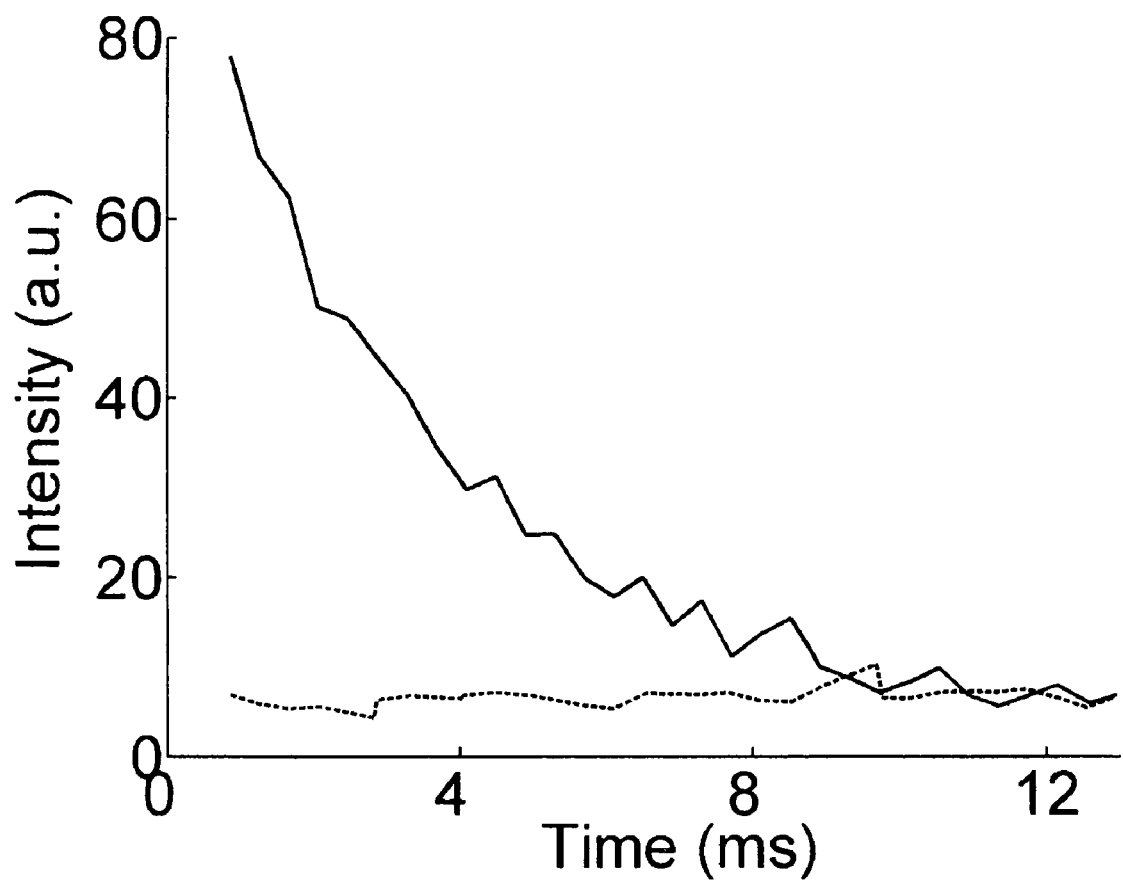
FIG. 7 is an observed CPMG decay (solid line) for a polyisoprene rubber sample measured at 2.01 MHz with the fabricated array of FIG. 3.

FIG. 7 shows a test measurement made with the array. The solid line represents the peak magnitudes for the first 32 echoes in a phase cycled CPMG sequence using a polyisoprene rubber sample larger than the sensitive volume selected by the coil. The dashed line represents the noise level for the system. It is observed that there is a large amount of noise present in the acquisition. This is attributed to the open design of the array along with the low acquisition frequency. The echo time was 0.4 ms. 32 echoes were acquired with 512 averages. A nominal 90° degree pulse length of 2 μs, along with a corresponding 180° degree pulse of 4 μs was used in the acquisition. The observed decay constant was $T_{2eff}=3.3$ ms. The $T_2$ of the polyisoprene sample was 1.4 ms at 8.3 MHz. Differences between these values are attributed to the change in $B_0$ strength, as well as a slight spin locking effect brought on by the inhomogeneous field and short echo time. The dashed line shows the noise level in a measurement made with no sample present. The observed noise in the measurement is high due to the low frequency and open design of the array.

Figure 8:
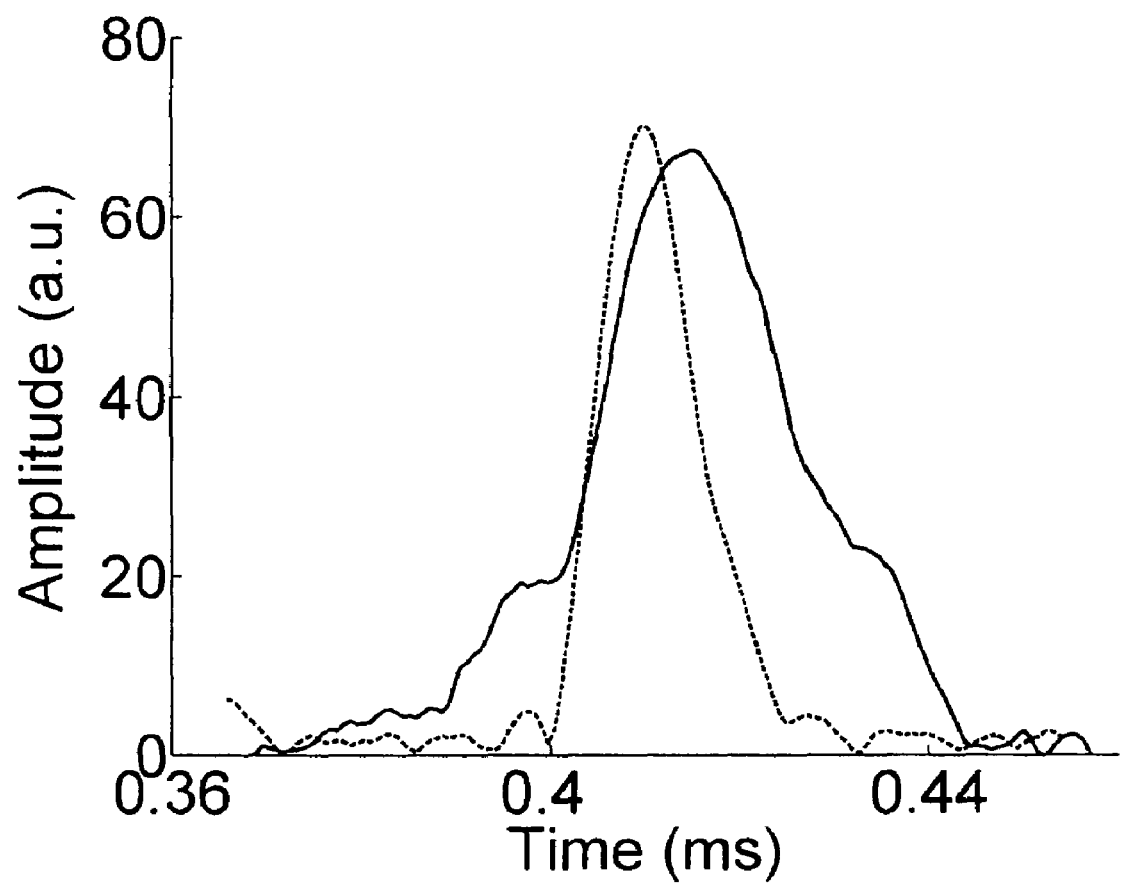
FIG. 8 is a comparison between spin echoes observed using the array of FIG. 3; at 2.01 MHz (solid line) and a commercial unilateral NMR sensor at 14.85 MHz (dashed line)

FIG. 8 compares single echoes acquired with α-τ-2α-τ pulse sequence. The solid line shows an echo acquired from a polyisoprene sample using the prototype array while the dotted line shows an echo acquired from the same sample using a commercial MOUSE system operating at 14.85 MHz using a 1 cm diameter, one turn surface coil with a quality factor of approximately 80. For the commercial system, the size of the sensitive volume was completely limited by the homogeneity of $B_0$, rather than the geometry of the RF coil. The nominal 90° and 180° pulse widths for the array measurement were 2 μs and 4 μs respectively. For the MOUSE measurement, the pulse width was fixed at 6 μs and the amplitude was adjusted to achieve the appropriate flip angles. All other experimental parameters for both measurements were identical.

It is observed that both echoes shown in FIG. 8 have comparable SNR levels. This indicates that the increase in the size of the sensitive volume resulting from the controlled $B_0$ field in the array, along with the coil design, compensates for any SNR disadvantages due to the lower operating frequency. It is expected that optimization of the coil design would result in a substantial increase in SNR.

The echo observed from the array is also much broader than that from the MOUSE. The observed $T_2^*$ is on the order of 10's of μs, indicating broadband excitation from the short RF pulse. In a strongly inhomogeneous static field, the observed signal lifetime is approximately equal to the duration of the RF pulse due to the wide range of precession frequencies of the excited spins. This is true for the MOUSE measurement, however despite the shorter pulses used with our array, the signal lifetime is much longer. The 'shoulders' observed on the echo from our array have been observed elsewhere in measurements and simulation at comparable magnetic field strengths and homogeneities.

Both measurements were made on a polyisoprene sample larger than the sensitive volume of the devices. The echo time was 0.4 ms and 512 scans were used. Both measurements exhibit comparable SNRs, despite the factor of 33 disadvantage inherent in our sensor due to the lower $B_0$. The echo for the prototype array is broader than that for the commercial instrument, although the excitation bandwidth is broader.

Field Inhomogeneity Measurement

Figure 9:
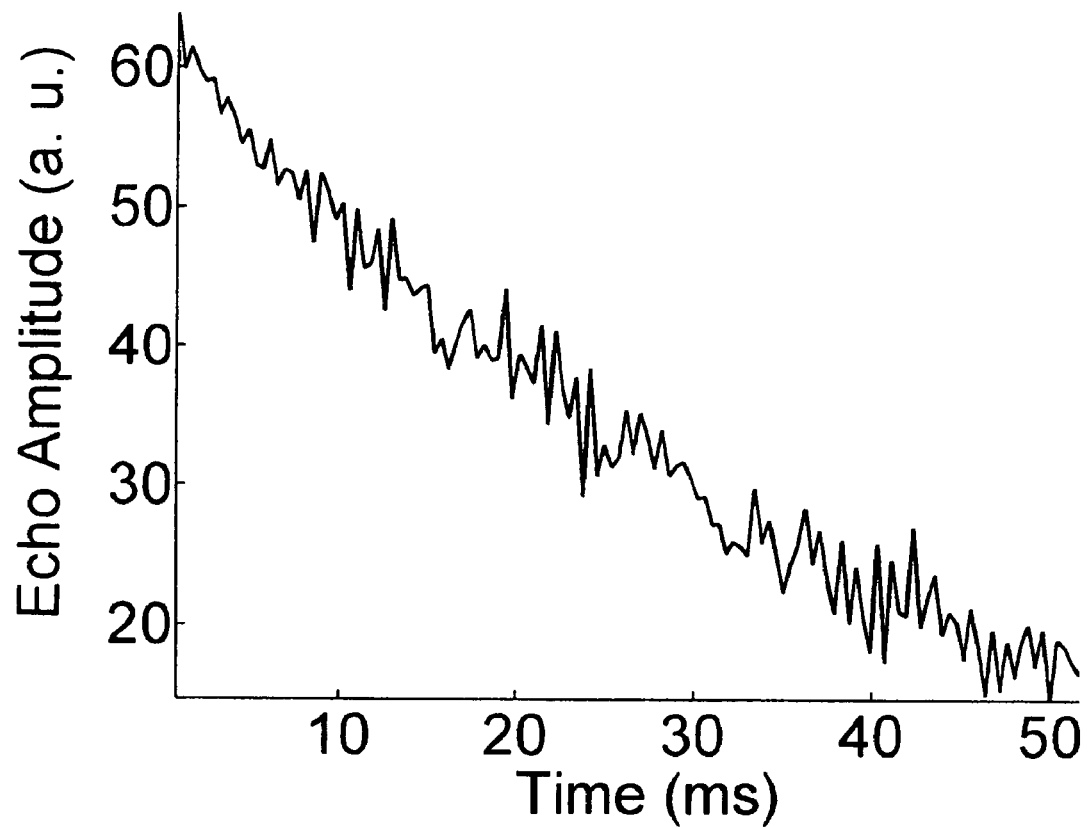
FIG. 9 is a CPMG measurement of a liquid sample using the array of FIG. 3.

Measurements on diffusive samples were made in order to quantitatively assess the homogeneity of the $B_0$ field for the prototype array. Using a doped water sample larger than the instrument sensitive volume, the effects of diffusive attenuation on a CPMG measurement were examined for the array. A CPMG decay for this sample obtained with the array is presented in FIG. 9. The sample was a bottle of doped water ($T_2$=36.2 ms at 8.3 MHz) much larger than the sensitive volume of the device. The echo time was 0.4 ms and 512 scans were averaged. The observed relaxation constant was 45 ms, indicating that the effects of diffusion were negligible. A signal lifetime of <2 ms was observed for the same measurement using a commercial unilateral NMR sensor. The discrepancy between the observed relaxation constant and the sample $T_2$ results from a combination of spin-locking effects and the difference in frequency.

The observed decay constant is 45 ms, in agreement with the sample $T_2$, indicating that diffusive attenuation has a negligible effect on this measurement. Identical measurements made with the commercial unilateral sensor showed a decay constant of 1.3 ms, clearly the result of diffusive attenuation brought on by the strong gradient associated with this device. While this is desirable in some applications, the advantage in observing fast-diffusing systems will be understood. The observed decay constants for the doped water and the polyisoprene sample were slightly longer than the sample $T_2$ values measured at 8.3 MHz. This is attributed to the contribution of $T_{1\rho}$, the sample spin-lock relaxation constant, and $T_1$, the spin lattice relaxation time, due to the inhomogeneity of $B_0$[24]. Furthermore, the difference in frequency could have an effect on the sample $T_2$. Since diffusive attenuation is irreversible, the effects of $T_{1\rho}$ and $T_1$ do not enter in to comparisons concerning this effect. The decreased sensitivity to diffusion exhibited by the prototype represents a tremendous advantage in measuring rapidly diffusing samples, and alludes to the homogeneity of $B_0$.

In order to quantify this homogeneity, the effects of diffusive attenuation on the signal from a distilled water sample larger than the: sensitive volume were measured using the array while the echo time was varied. Assuming that the sample has a $T_2$ that is much longer than the decay constant due to diffusion, the observed decay constant for a CPMG measurement is given by:

$$\frac{1}{T_{2eff}} = \frac{\gamma^2 D}{3} G^2 \tau^2 \qquad (7)$$

Figure 10:
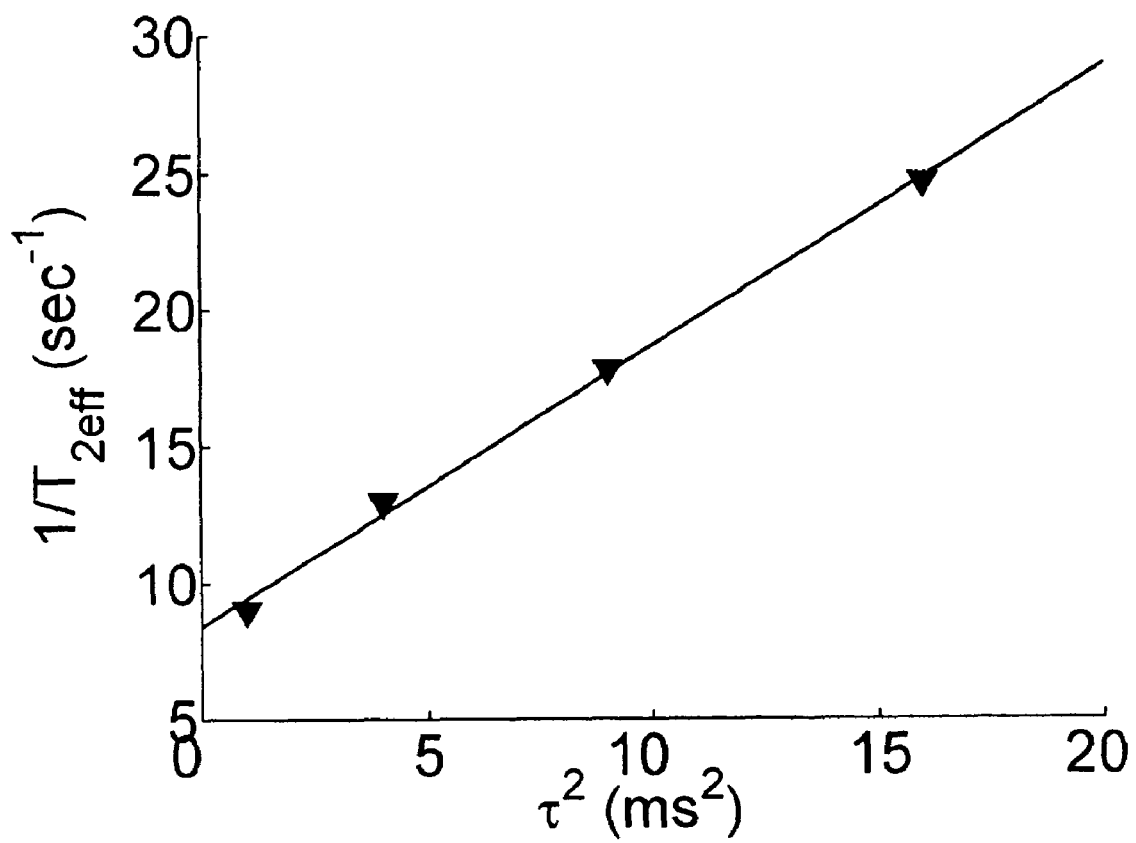
FIG. 10 is a plot of the inverse of the observed decay constant against the echo time squared for a series of CPMG measurements made using the array of FIG. 3 and at various echo times for a distilled water sample.

Varying $\tau$ and plotting the inverse of the effective decay constant against $\tau^2$ results in a straight line with a slope related to the gradient, G, in $B_0$. FIG. 10 shows such a plot measured using the array for $\tau$ values between 1 ms and 4 ms. The slope of the line is $1.03 \times 10^6$ s$^3$. Assuming the diffusion constant of distilled water to be $2.51 \times 10^{-9}$ m$^2$/s at room temperature, the calculated gradient is 0.13 T/m.

Moisture Detection in Composite Panels

The object behind the development of this prototype was the detection of moisture within composite sandwich panels. It will be understood, however, that this is but one potential application for the invention. Because of the difficulties associated with this type of sample, measurements using conventional unilateral NMR devices have previously yielded unacceptable results. In order to validate the prototype array, measurements were made of a representative composite test sample. The sample consisted of a 4 cm×4 cm sandwich panel, 16 mm in thickness. The panel had an anodized aluminum honeycomb core sandwiched between graphite epoxy composite skins. Ten central cells of the honeycomb lattice were partially filled with a total of ~2 mL of doped water. The goal of the moisture detection was to see a clear NMR signal from the water within the cells despite the shielding effects of the graphite skin and aluminum core.

Figure 11:
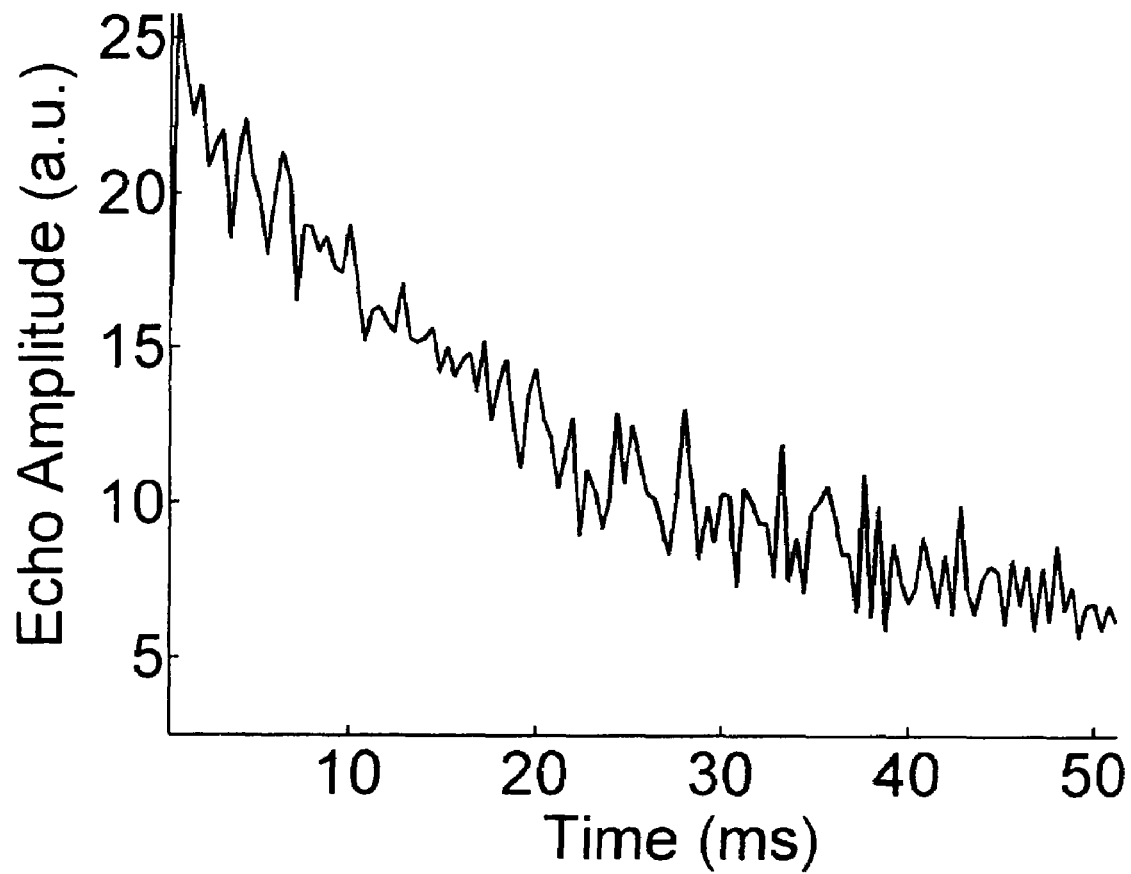
FIG. 11 is a CPMG measurement of water inside of a representative sample of aluminum/epoxy/graphite composite.

FIG. 11 shows the signal observed from the water with the prototype array. Ten cells inside of a 4 cm×4 cm composite sample were filled with approximately 2 mL (total) doped water for this measurement. The prototype, with an echo time of 0.4 ms and 512 scans, yields a strong and readily interpretable result. This is attributed to the larger sensitive volume, a better field homogeneity and the lower RF frequency, allowing better $B_1$ penetration through the conductive skin. The CPMG decay is both strong and relatively long lived. This is a combination of the larger sensitive spot and better field homogeneity of the array, as well as the lower frequency of the RF field. The low frequency of this prototype permits RF penetration of the graphite skin. This results in a successful measurement which was not possible with the commercial MOUSE due to its higher frequency of operation.

Experimental Details

Optimization of Eq. (5) used the Nelder-Mead simplex method (see J. A. Nelder, R. Mead, A simplex method for function minimization, The Computer Journal, 7 (1965) 308-31), implemented in the Matlab (The Mathworks, Natick, Mass.) software package. Finite element simulations used the FEMLAB (Comsol, Burlington, Mass.) package. The relative magnetic permeability of the NdFeB magnets was assumed to be 1.05; that of the iron yoke, as well as that of the pole pieces was assumed to be 100. The permeability of the aluminum frame was not considered. The simulation used 14,483 mesh nodes.

The magnetic arrays of the present invention can by used with commercially available unilateral NMR systems such as a Bruker (Rheinstetten, Germany) MOUSE, driven by a Minispec mq Series console running Minispec V2.41 software. The resonant frequency was 14.85 MHz, resulting in the selection of a ~5 mm×5 mm×~1 mm sensitive volume displaced 5 mm from the surface of the MOUSE. The RF amplifier was rated for 300 Watts. A Bruker surface coil was used for all measurements except the sandwich panel. The nominal pulse width of 6 μ s was selected by varying the pulse width to maximize the echo amplitude in a spin echo measurement. For the sandwich panel measurements, a homebuilt 1 cm diameter 2 turn inductively coupled surface coil with a resonant frequency of 15.0 MHz was used with the MOUSE. The optimal pulse width was 11 μ s.

The low $^1$H frequency for the prototype array precluded the use of the Bruker console alone for acquisition. The Bruker Minispec software and pulse programming hardware were used, however the Minispec amplifier was replaced with an Amplifier Research (Bothell, Wash.) 200L 300 W broadband amplifer. A preamplifier built around a Miteq (Hauppauge, N.Y.) RF amplifier was used in detection. The amplifier did not allow amplitude control to be programmed and thus different 90° and 180° pulse lengths were required. Pulse lengths of 2 μ s and 4 μ s respectively were selected by maximizing the amplitude of an observed spin echo. For the sandwich panel measurements, these values were modified to 3 μ s and 6 μ s. All measurements used a 10 turn 2 cm diameter capacitively coupled surface coil. The resonant frequency was 2.01 MHz.

The doped water samples used Gadolinium Chloride as the doping agent and had a measured $T_2$ of 36.2 ms at 8.3 MHz. The polyisoprene sample had a measured $T_2$ of 1.3 ms at 8.3 MHz. These measurements were performed in the homogeneous magnetic field of a permanent magnet system with a 14 cm pole gap.

Planar Magnet Arrays

In another embodiment of the invention, analytical linear algebra methods are used in place of numerical optimization methods to define the magnet sizes and pole shapes and in particular, the coefficients (a) and (c) in equation (3).

In another embodiment of the invention, the scalar potential design method according to the invention can be used to yield an array design with the pole pieces omitted but which retains the rational control of $B_0$.

A permanent magnet has an associated scalar potential in its own right. By appropriately combining the scalar potential functions associated with an array of magnets with arbitrarily sizes and shapes, it is possible to have a measure of control over $B_0$ simply based on the magnet characteristics. The omission of pole pieces is advantageous in that it reduces the complexity of the design in some cases.

A comparison between the scalar potentials and associated magnetic fields for a magnet array both with and without pole pieces is given below. For the case considered, the scalar potential contours due to the magnets are similar to those defining the pole pieces, allowing a similar magnetic field to be obtained from the magnets alone. The new magnet array was designed for the purpose of in-situ non-destructive testing of aerospace composites. Results show that the array can be used to rapidly detect small quantities of water within a graphite/aluminum panel.

Design Method

In two dimensions, an arbitrary scalar potential, $\phi$ (z-y) will satisfy $$\phi(z, y) = \sum_{n=1}^{N} e^{-a_n y}[b_n \cos(a_n z) + c_n \sin(a_n z)] \quad (8)$$

Preserving only the sine term (odd symmetry), the associated magnetic field, $B=\nabla\phi$, is $$B = \sum_{n=1}^{N} a_n c_n e^{-a_n y}[\cos(a_n z)\hat{z} - \sin(a_n z)\hat{y}]. \quad (9)$$

With $a_n$=na, at the z-origin, the field as a function of y is $$|B(0, y)| = \sum_{n=1}^{N} m_n e^{-nay} \quad (10)$$

where $m_n$=$nac_n$. The $i^{th}$ derivative of Eq (3) is $$|B(0, y)|^{(i)} = \sum_{n=1}^{N} (-1)^i (na)^i m_n e^{-nay}. \quad (11)$$

Consider a desired magnetic field, $B_0$, with a gradient, G, about some point, y=d. Writing out the first i derivatives of Eq (3) and setting N=i+1 gives, in matrix form, $$\begin{bmatrix} e^{-ad} & e^{-2ad} & \cdots & e^{-Nad} \\ -ae^{-ad} & -2e^{-2ad} & \cdots & e-Ne^{-Nad} \\ \vdots & \vdots & \ddots & \vdots \\ (-1)^i(a)^i e^{-ad} & (-1)^i(2a)^i e^{-2ad} & \cdots & (-1)^i(Na)^i e^{-Nad} \end{bmatrix} \begin{bmatrix} m_1 \\ m_2 \\ \vdots \\ m_n \end{bmatrix} = \begin{bmatrix} B_0 \\ G_y \\ \vdots \\ 0 \end{bmatrix}. \quad (12)$$

Simplifying Eq (5) to AM=B, the m coefficients which give the desired field are determined through a simple matrix inversion:

$$M=A^{-1}B. \quad (13)$$

Array Design and Construction

Using a method according to the invention, an array was designed to have a field gradient of zero (saddle point) at a position 4.5 cm above the face of the magnets. The design uses only two c parameters in Eq. (8). The design here is similar to the array shown in FIG. 4 but uses a slightly larger array. Comparison with the array of FIG. 4 indicates that for this case, the numerical optimization yields a result similar to the new method.

Figure 12B:
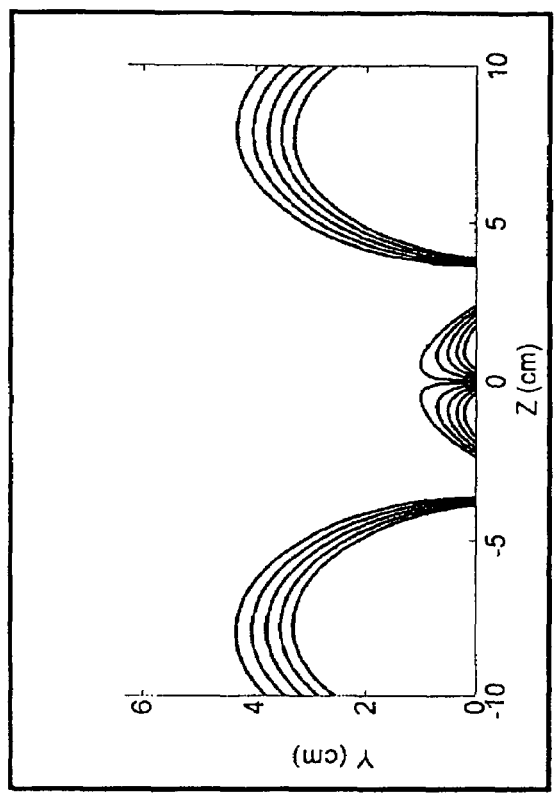
FIG. 12(b) shows analogous scalar potential contours from the array of four magnets specified by the design of FIG. 12(a).
Figure 12A:
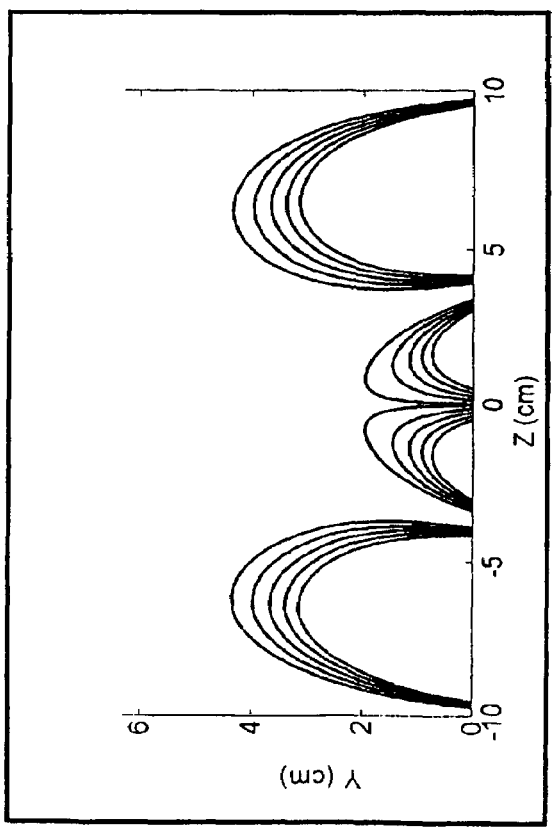
FIG. 12(a) illustrates a selection of scalar potential contours provided by an optimization method according to the invention.

FIG. 12(a) illustrates a selection of scalar potential contours provided by the optimization that may be used as the shape of the high permeability pole pieces. The intersection of the contours with the y-origin defines the number and size of the magnets, while the relative magnitudes define the magnet strengths.

FIG. 12(b) shows analogous scalar potential contours from the array of four magnets specified by the design, calculated without the pole pieces. While the contours are clearly different, the general trend is the same. From Eq. (9), small scale properties of $B_0$, associated with higher spatial frequencies, will decay at a faster rate with distance from the array. For this reason, in some cases, a large scale trend in the shape of the scalar potential is all that is required to give the same approximate field.

Figure 13:
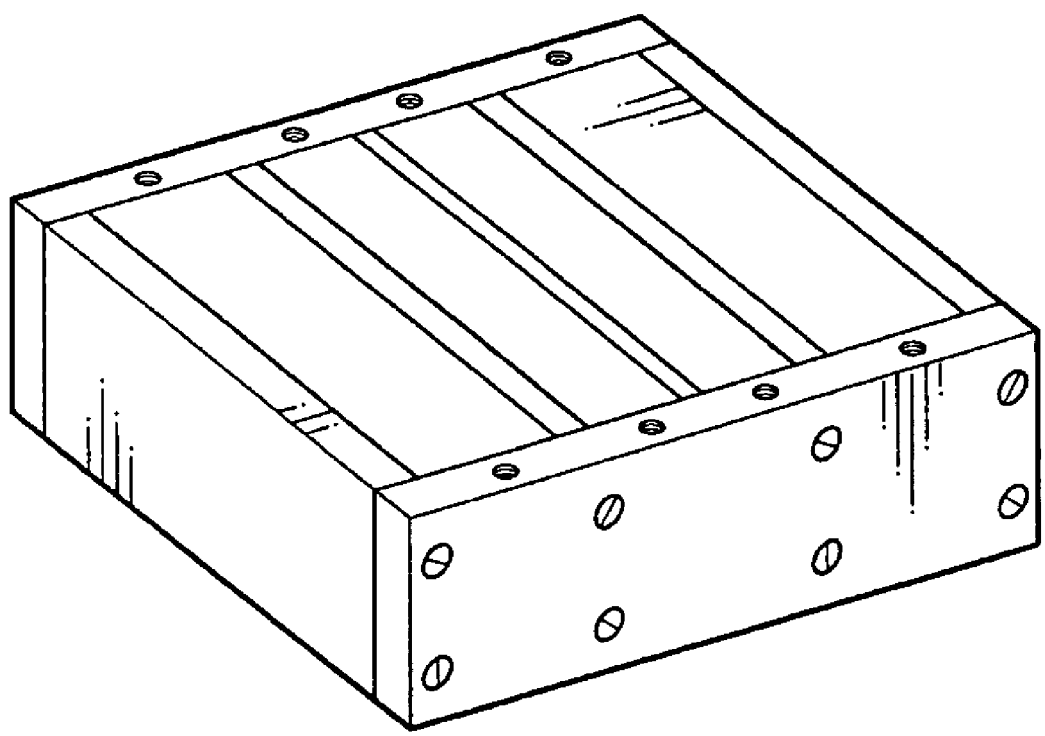
FIG. 13 is a photograph of a magnet array according to the invention, built without pole pieces.

FIG. 13 is a photograph of the magnet array, built without pole pieces. The magnets are NdFeB, with a 1006/1008 steel yoke joining them on the underside. The orientation of the magnets, along with the shape of the poles is shown in FIG. 14(a). A contour plot of the calculated field with the pole pieces in place is shown in plot 14(b), while 14(c) illustrates the field calculated without the poles. As expected, near the array the fields are very different, however in the vicinity of the saddle point, they are quite similar. For the case of the planar array, the saddle point is slightly closer to the magnets. While all plots here have been normalized, the field would also be stronger with the pole pieces in place. The field from the array, constructed without the pole pieces, was measured—FIG. 14(d)—to confirm the calculations. The agreement is close, and it was found that the $^1$H frequency at the center of the saddle point was approximately 3.5 MHz. If this low field is acceptable for the application, the pole pieces are clearly not necessary.

It is important to point out that foregoing the pole pieces will not be an option for all magnet geometries. If the sensitive spot was closer to the array, or the shape of the pole pieces is more complex, the results will not agree.

Application

The magnet array without pole pieces was designed for the purpose of nondestructive inspection of aerospace composites (graphite—aluminum honeycomb composites) used as control surfaces in modern, high-performance aircraft.

Moisture ingress into these composites has been linked to catastrophic failure, and magnetic resonance has been demonstrated to be promising for in-situ detection of water within the aluminum cells. In order to make UMR a viable detection technique, rapid, definitive detection of water is required. Because the water is sealed in a conductive panel, magnetic resonance measurements are inherently insensitive. The large, relatively uniform region of $B_0$ was designed into our array in order to make it more sensitive than previous UMR systems.

The measurements discussed above using the prototype array naming pole pieces according to the invention for detecting water for this application measured a simple CPMG decay. While detection was possible, the averaging required for a successful experiment made the measurement long. Following Casanova et al. (G. Guthausen, A. Guthausen, G. Balibanu, R. Eymael, K. Hailu, U. Schmitz, and B. Blümich, Soft-matter analysis by the NMR-MOUSE, Macromol. Mater. Eng. 276/277 (2000) 25-37, and incorporated herein by reference) in another embodiment of the invention, a multi-echo averaging scheme to increase the acquisition speed was used. The echo time was 0.4 ms, and 128 echoes were averaged. An echo is visible after only one scan, and can be definitively detected within eight. This type of measurement would not be possible in the higher gradient associated with many UMR arrays, since the apparent signal lifetime would be severely limited by diffusive attenuation.

Grouse

Figure 15:
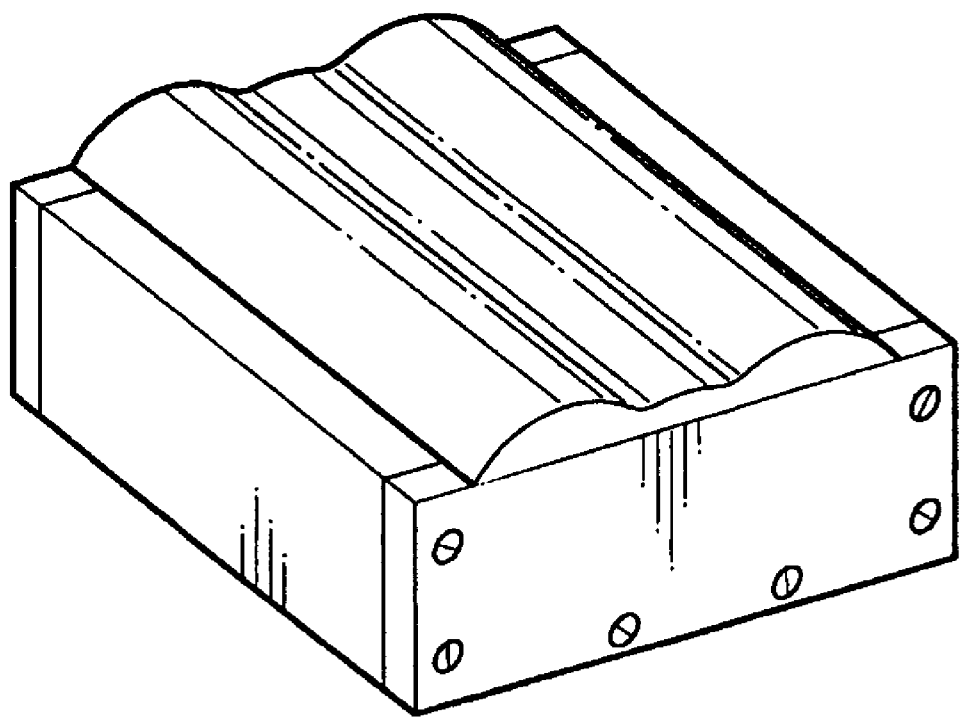
FIG. 15 is a photograph of a GROUSE magnet array according to the invention.

Another embodiment of a magnetic array according to the present invention is shown in FIG. 15 which includes a single but more complex pole piece (referred to as GROUSE). The pole piece used is shown in FIG. 16.

Figure 17:
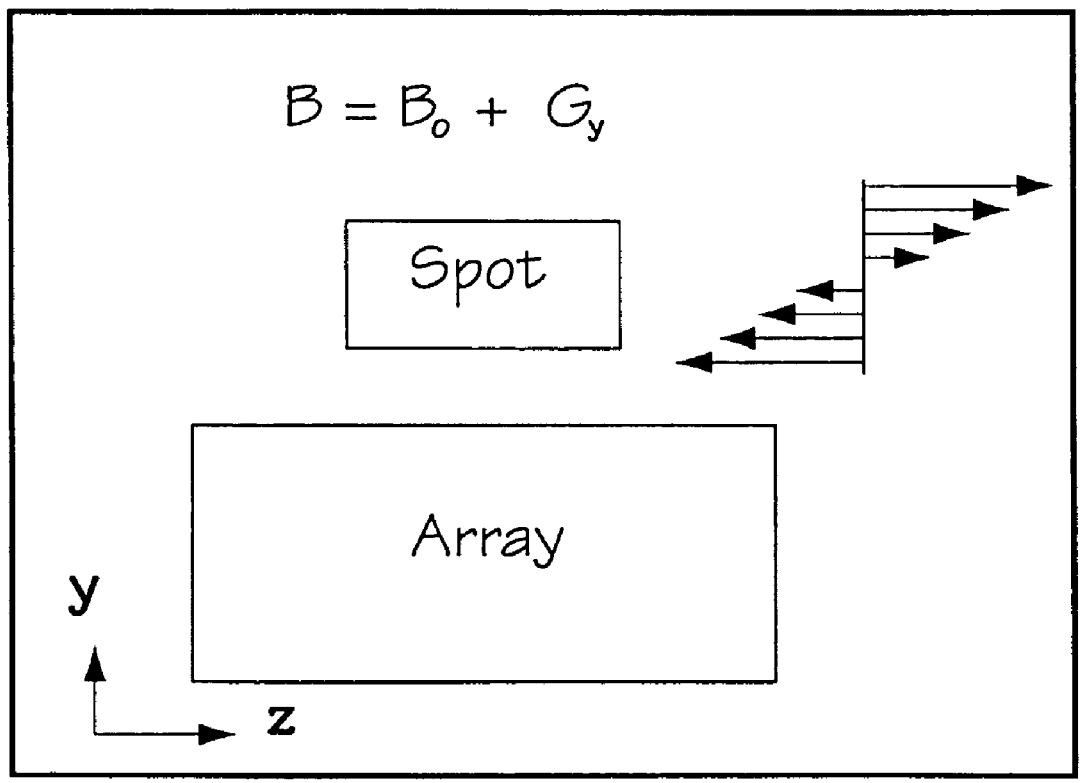
FIG. 17 is a schematic diagram of an array with a fixed linear gradient, according to the invention.

Referring to FIG. 17, array has a "built in" or "fixed" linear y-direction field gradient and a spatially varying magnetic field which changes as one moves away from the magnet pole piece surface. There is a region of space where the variation of the magnetic field is linear with distance—this is the region of linear gradient. Since the gradient is linear, there is a direct connection between frequency and space, ie in this region a one-dimensional image, a profile, which is an accurate rendering of the test object can be generated. The GROUSE array can be designed using the methods previously described.

Figure 16:
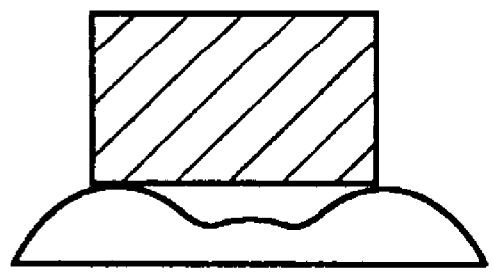
FIG. 16 is the side view of the pole piece of FIG. 15 with a sample.

The pole piece shown in FIG. 16 can be used with a single magnet or an array of two or more magnets.

Since the magnetic field gradient is linear and can by used to generate profiles, profiles can be generated from restricted regions of space within the linear gradient (ie focus on sub sections of the profile). This is accomplished through band selective RF pulses which have a frequency selectivity, and by varying the length of the pulse, the width of the frequencies excited can by altered which in turn changes the 'width' of the object in the profile. For example, if the target region is the region of the crust in a french fry for a profile, band selective pulses can be used to generate a profile from only that region of interest.

EXAMPLE

In the prototype GROUSE array shown in FIG. 16, the following design criteria was used:

$B_0$ normal to magnet surface;

Gradient, G=~30-50 Gauss/cm;

Sensitive Spot 2.5 cm above magnet, pole pieces must fit within this region; and Gradient Linearity:

$$\left.\frac{\partial^2 \vec{B}_0}{\partial y^2}\right|_{y=2.5} = 0$$

It will be understood that the methods of the invention can be used to design and construct a variety of unilateral magnet arrays and families of arrays including (1) a single magnet and single pole piece, which forms a linear gradient through the sensitive spot, (2) a four magnet array with four pole pieces which has a uniform sensitive spot and (3) a four magnet array with a uniform sensitive spot which lacks pole pieces entirely.

We claim:

1. A unilateral NMR sensor comprising:
a ferromagnetic yoke;
a permanent magnet arranged on the yoke;
a pole piece on the magnet; and
a coil for generating a dynamic magnetic field, the coil further for sensing an NMR signal;
the pole piece including an air-pole piece interface surface whose shape corresponds to an equipotential contour of a magnetic scalar potential obtained by solution to Laplace's equation;
the dimension of the permanent magnet and pole piece assembly measured in a direction substantially perpendicular to the direction of magnetization of the permanent magnet substantially coinciding with the distance between two portions of the equipotential contour;

whereby the field generated by the at least one magnet in a region of interest substantially matches with the gradient of said magnetic scalar potential.

2. A magnetic field apparatus suitable for use in unilateral nuclear magnetic resonance, the magnetic field apparatus capable of at least generating a field, the magnetic field apparatus comprising:

at least one magnet assembly having at least one pole, a dimension of the at least one magnet assembly at the at least one pole measured in a direction substantially perpendicular to the direction of magnetization of the at least one magnet assembly substantially coinciding with the distance between two portions of a contour line of a magnetic scalar potential obtained by solution to Laplace's equation;

whereby the field generated by the at least one magnet assembly in a region of interest substantially matches with the gradient of said magnetic scalar potential.

3. The magnetic field apparatus as recited in claim 2, wherein the at least one magnet assembly comprises a magnet array.

4. The magnetic field apparatus as recited in claim 2, wherein the at least one magnet assembly comprises at least one magnet and at least one pole piece on the at least one magnet.

5. The magnetic field apparatus as recited in claim 2, further comprising a ferromagnetic yoke, whereby the at least one magnet assembly is arranged on the ferromagnetic yoke.

6. The magnetic field apparatus as recited in claim 2, wherein the contour line is easily machined.

7. The magnetic field apparatus as recited in claim 2, wherein the contour line is below the region of interest.

8. The magnetic field apparatus as recited in claim 2, wherein the two portions of the contour line are substantially parallel to the sides of the at least one magnet assembly.

9. The magnetic field apparatus as recited in claim 2, further comprising at least one pole piece having a profile that substantially coincides with the contour line of the magnetic scalar potential, the at least one pole piece positioned on the at least one pole of the at least one magnet assembly so that the profile of the at least one pole piece substantially coincides with the contour line of the magnetic scalar potential, thereby increasing the degree with which the field generated in the region of interest substantially matches with the gradient of the magnetic scalar potential.

10. The magnetic field apparatus as recited in claim 2, wherein the magnetic scalar potential only admits magnetic fields in a direction substantially perpendicular to the direction of magnetization of the at least one magnet in the region of interest.

11. The magnetic field apparatus as recited in claim 2, wherein the magnetic scalar potential only admits magnetic fields in a direction substantially parallel to the direction of magnetization of the at least one magnet in the region of interest.

12. The magnetic field apparatus as recited in claim 2, wherein the magnetic scalar potential exhibits lateral symmetry.

13. The magnetic field apparatus as recited in claim 2, further comprising at least one dynamic field generator.

14. The magnetic field apparatus as recited in claim 13, wherein the at least one dynamic field generator comprises a coil.

15. The magnetic field apparatus as recited in claim 14, further comprising an RF pre-amplifier module connected to the coil suitable for receiving and amplifying an RE signal compatible with nuclear magnetic resonance.

16. The magnetic field apparatus as recited in claim 14, further comprising a detection module connected to the coil for detecting an RF signal compatible with nuclear magnetic resonance.

17. A method of making a magnetic field apparatus suitable for use in unilateral nuclear magnetic resonance, the magnetic field apparatus capable of at least generating a field, the method comprising:

(a) defining a magnetic field requirement within a region of interest;

(b) determining a magnetic scalar potential by solution to Laplace's equation given the magnetic field requirement such that the gradient of the magnetic scalar potential substantially matches the predetermined field requirement within the region of interest;

(c) determining a contour line of the magnetic scalar potential;

(d) providing at least one magnet having a pole, the dimension of the at least one magnet measured in a direction substantially perpendicular to the direction of magnetization of the at least one magnet at the pole substantially coinciding with the distance between two portions of the contour line; and (e) positioning the magnet relative to the region of interest so that the width of the at least one magnet coincides with the two portions of the contour line;

whereby the field generated in the region of interest by the at least one magnet substantially matches with the gradient of the magnetic scalar potential.

18. The method as recited in claim 17, wherein the magnetic field requirement includes a ratio of gradient to field strength requirement.

19. The method as recited in claim 17, wherein the magnetic field requirement includes a homogeneity requirement.

20. The method as recited in claim 17, wherein the magnetic field requirement includes a uniformity requirement.

21. The method as recited in claim 17, further comprising the steps of:

(a) providing at least one pole piece having a profile that substantially coincides with the contour line; and (b) positioning the at least one pole piece relative to the region of interest so that the at least one pole piece profile substantially coincides with the contour line of the magnetic scalar potential;

thereby increasing the degree with which the field generated in the region of interest substantially matches with the gradient of the magnetic scalar potential.

22. The method as recited in claim 17, wherein the step of determining the magnetic scalar potential comprises the acts of:

(a) expressing a scalar potential expression by using a finite number of summation operations of summands wherein the summands include a finite number of coefficients, each summand substantially comprising a solution to Laplace's equation;

(b) expressing an approximation of the magnetic field in terms of the finite number of coefficients by taking the gradient of the scalar potential expression;

(c) adjusting the finite number of coefficients to satisfy the field requirement in the region of interest; and (d) determining the magnetic scalar potential using the finite number of coefficients.

23. The method as recited in claim 22, wherein the step of determining the magnetic scalar potential further comprising at least one of the acts of:
(a) applying numerical optimization to determine the finite number of coefficients; and
(b) applying linear algebra to determine the finite number of coefficients.

24. The method as recited in claim 23, wherein the act of applying numerical optimization further includes the act of performing a least square minimization.

25. The method as recited in claim 23, wherein the act of applying linear algebra further includes the acts of:
(a) expressing a derivative of the approximation of a magnetic field in terms which include the finite number of coefficients;
(b) relating at least one of the approximation of a magnetic field and the derivative of the approximation of a magnetic field to the magnetic field requirement so as to obtain a finite number of equations relating the finite number of coefficients to the magnetic field requirement;
(c) determining the finite number of coefficients using the finite number of equations and the magnetic field requirement.

26. The method as recited in claim 25, wherein the derivative is the $i^{th}$ order derivative of the approximation of a magnetic field.

27. The method as recited in claim 17, further comprising the step of applying a simplifying constraint.

28. The method as recited in claim 17 wherein the field requirement includes a requirement that the magnetic field gradient strength is substantially constant throughout the region of interest.

29. The method as recited in claim 17, wherein the field requirement includes a requirement that the magnetic field gradient strength is substantially zero throughout the region of interest.

30. A magnetic field apparatus suitable for unilateral nuclear magnetic resonance comprising:
at least one magnet assembly having at least one pole, the shape of a portion of the at least one magnet assembly corresponding to an equipotential contour of a magnetic scalar potential obtained by solution to Laplace's equation in absence of the at least one magnet assembly;
the dimension of the at least one magnet assembly measured in a direction substantially perpendicular to the direction of magnetization of the at least one pole substantially coinciding with the distance between two portions of the equipotential contour;
whereby the field generated by the at least one pole in a region of interest substantially matches with the gradient of said magnetic scalar potential.

* * * * *

UNITED STATES PATENT AND TRADEMARK OFFICE
CERTIFICATE OF CORRECTION

PATENT NO. : 7,319,326 B2 Page 1 of 1
APPLICATION NO. : 11/232904
DATED : January 15, 2008
INVENTOR(S) : Andrew E. Marble et al.

It is certified that error appears in the above-identified patent and that said Letters Patent is hereby corrected as shown below:

Title Page of Invention: Sensor and magnetic field apparatus suitable for use in for unilateral nuclear magnetic resonance and method for make same
Should read: Sensor for Unilateral Nuclear Magnetic Resonance and Method for Making Same Assignee: University of New Brunswick (Fredencion, New Brunswick, CA)
Should read: University of New Brunswick (Fredericton, New Brunswick, CA)

Attorney, Agent or Firm: Eugene F. Derenyl
Should read: Attorney, Agent or Firm: Eugene F. Derenyi Firm Address: STIKEMAN ELLIOTT
1600-50 O'Connor Street
Ottawa, ON K1P LS2
CANADA Should read: STIKEMAN ELLIOTT LLP
1600-50 O'Connor Street
Ottawa, ON K1P 6L2
CANADA Signed and Sealed this Eleventh Day of November, 2008

JON W. DUDAS
*Director of the United States Patent and Trademark Office*

UNITED STATES PATENT AND TRADEMARK OFFICE
CERTIFICATE OF CORRECTION

PATENT NO.        : 7,319,326 B2                                                Page 1 of 1
APPLICATION NO.   : 11/232904
DATED             : January 15, 2008
INVENTOR(S)       : Andrew E. Marble et al.

It is certified that error appears in the above-identified patent and that said Letters Patent is hereby corrected as shown below:

Title Page of Invention Item [54] and Column 1, lines 1-5:  Sensor and magnetic field apparatus suitable for use in for unilateral nuclear magnetic resonance and method for make same
Should read:  Sensor for Unilateral Nuclear Magnetic Resonance and Method for Making Same Assignee:  University of New Brunswick (Fredencion, New Brunswick, CA)
Should read:  University of New Brunswick (Fredericton, New Brunswick, CA)

Attorney, Agent or Firm:  Eugene F. Derenyl
Should read:  Attorney, Agent or Firm:  Eugene F. Derenyi Firm Address:   STIKEMAN ELLIOTT
                1600-50 O'Connor Street
                Ottawa, ON K1P LS2
                CANADA Should read:    STIKEMAN ELLIOTT LLP
                1600-50 O'Connor Street
                Ottawa, ON K1P 6L2
                CANADA This certificate supersedes the Certificate of Correction issued November 11, 2008.

Signed and Sealed this

Ninth Day of December, 2008

JON W. DUDAS
*Director of the United States Patent and Trademark Office*